(12) United States Patent
Shindo et al.

(10) Patent No.: US 8,258,472 B2
(45) Date of Patent: Sep. 4, 2012

(54) CHARGED PARTICLE RADIATION DEVICE AND IMAGE CAPTURING CONDITION DETERMINING METHOD USING CHARGED PARTICLE RADIATION DEVICE

(75) Inventors: Tamotsu Shindo, Hitachinaka (JP); Yuji Tange, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/142,153

(22) PCT Filed: Nov. 19, 2009

(86) PCT No.: PCT/JP2009/006207
§ 371 (c)(1),
(2), (4) Date: Jun. 24, 2011

(87) PCT Pub. No.: WO2010/073478
PCT Pub. Date: Jul. 1, 2010

(65) Prior Publication Data
US 2011/0260058 A1 Oct. 27, 2011

(30) Foreign Application Priority Data

Dec. 26, 2008 (JP) .................................. 2008-331826

(51) Int. Cl.
G01N 23/22 (2006.01)
H01J 37/28 (2006.01)
H01J 37/26 (2006.01)
(52) U.S. Cl. ........ 250/306; 250/307; 250/310; 250/311; 250/492.2; 250/492.3
(58) Field of Classification Search .................. 250/306, 250/307, 310, 311, 492.2, 492.3
See application file for complete search history.

(56) References Cited

U.S. PATENT DOCUMENTS

| 7,071,713 | B2 * | 7/2006 | Furukawa et al. ........ 324/750.19 |
| 2001/0015413 | A1 * | 8/2001 | Sasaki et al. ............... 250/492.3 |
| 2006/0288325 | A1 * | 12/2006 | Miyamoto et al. .............. 716/19 |
| 2007/0210252 | A1 | 9/2007 | Miyamoto et al. |
| 2008/0159609 | A1 | 7/2008 | Miyamoto et al. |

FOREIGN PATENT DOCUMENTS

| JP | 2006/351746 | 12/2006 |
| JP | 2007-250528 | 9/2007 |
| JP | 2008-147143 | 6/2008 |

* cited by examiner

*Primary Examiner* — Nikita Wells
(74) *Attorney, Agent, or Firm* — McDermott Will & Emery LLP

(57) ABSTRACT

A charged particle radiation device wherein the position or the size of a FOV can be easily determined even if a number of measuring points are provided on a sample, and an image capturing condition determining method using the charged particle radiation device are provided. An image capturing condition determining method wherein the field of view of a charged particle radiation device is determined so as to include a plurality of measuring points, characterized in that whether or not the measuring points are overlapped with four sides of the field of view is judged; the field of view is moved so that the measuring points are moved to the inside or outside of the field of view; and the position of the field of view after being moved is determined as a position of the field of view of the charged particle radiation device, and a device to realize the method are proposed. Further, a method for judging whether or not the measuring points are overlapped with the four sides, and changing the size of the field of view so as not to overlap the measuring points with each side, and a device therefor are proposed.

7 Claims, 12 Drawing Sheets

FIG.2
(a)
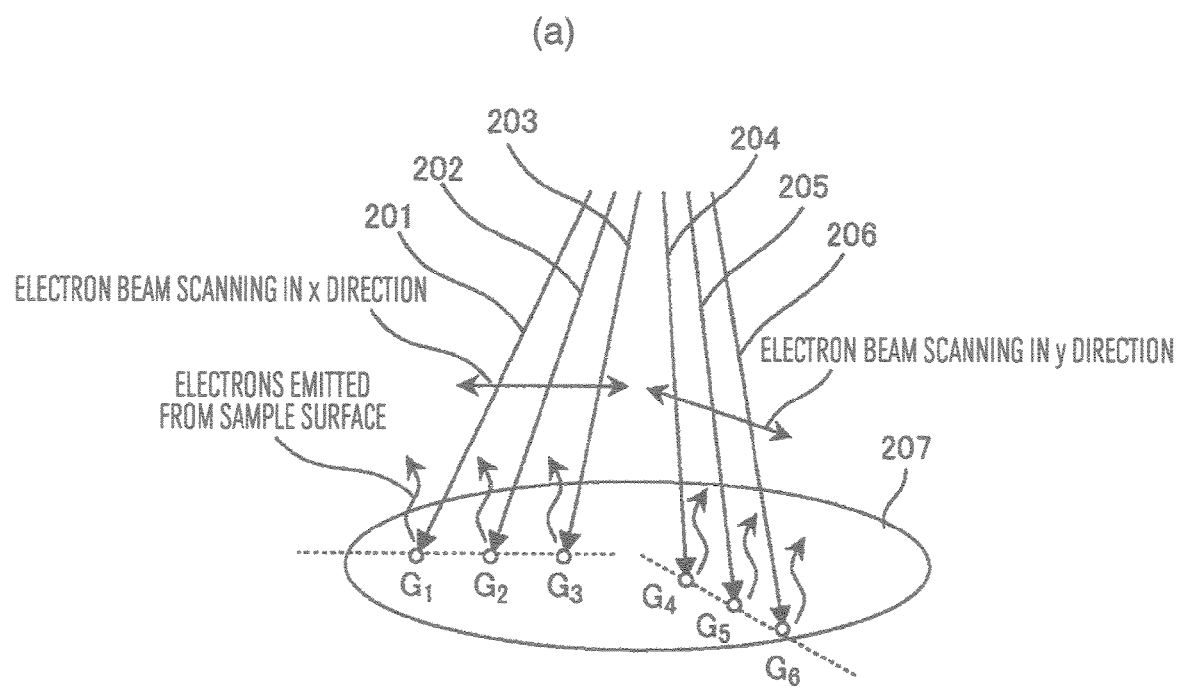
(b)
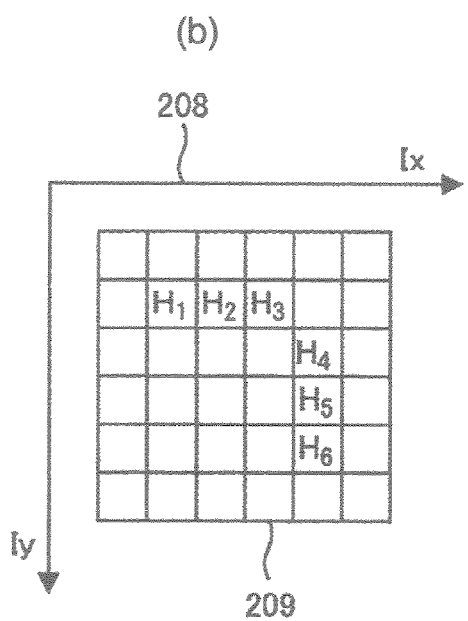

FIG.3
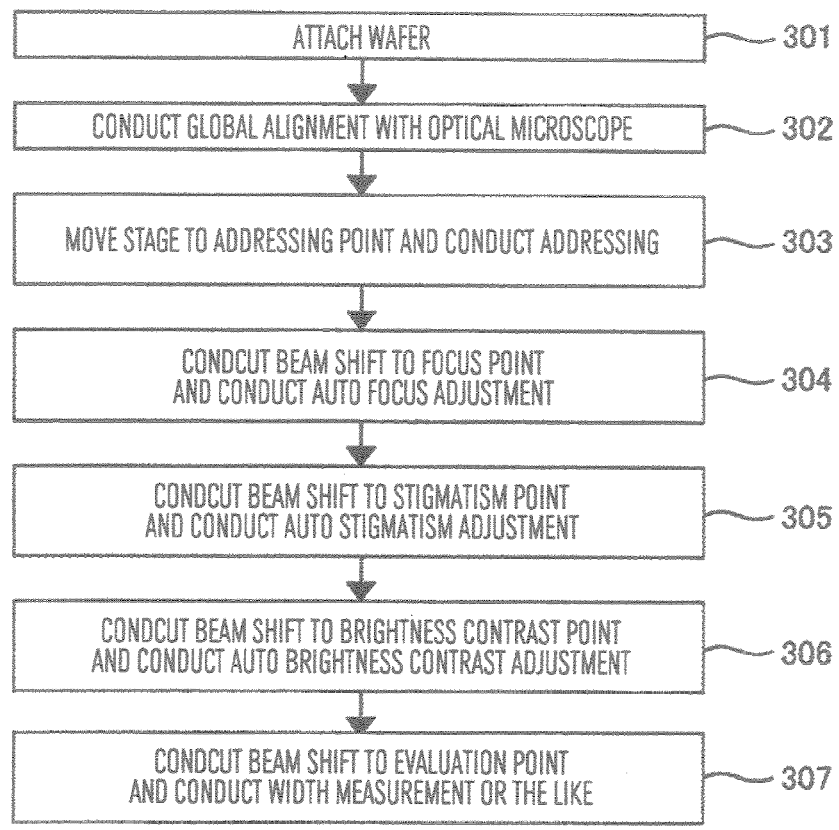
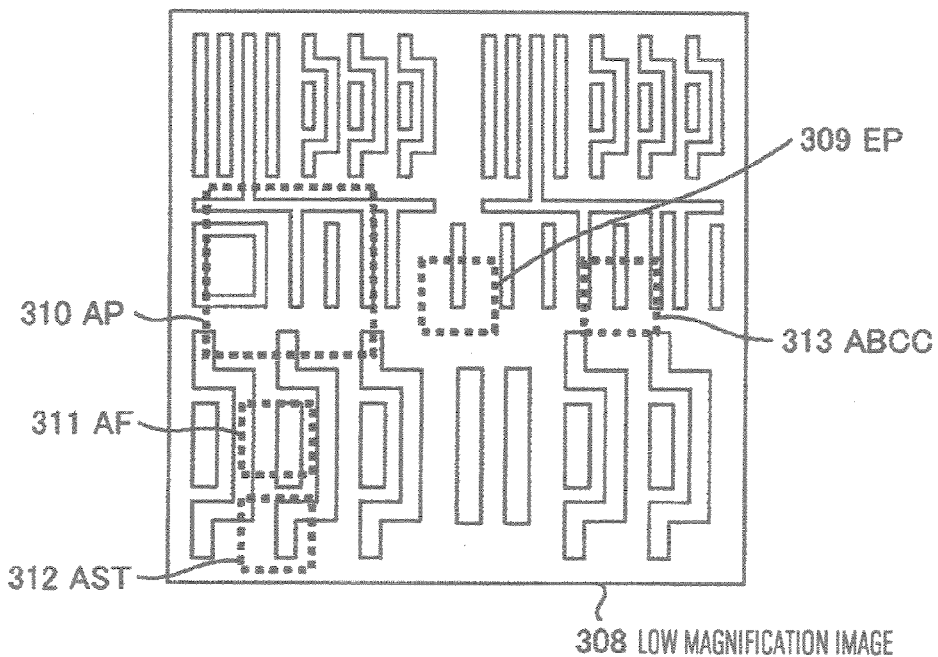

FIG.7
(a)
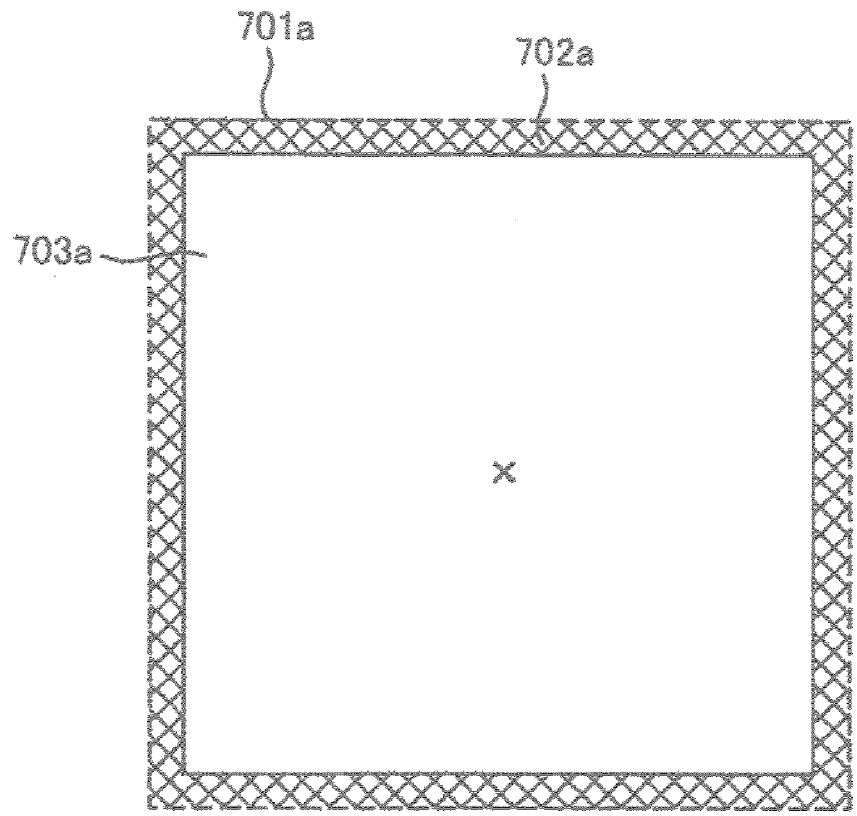
(b)
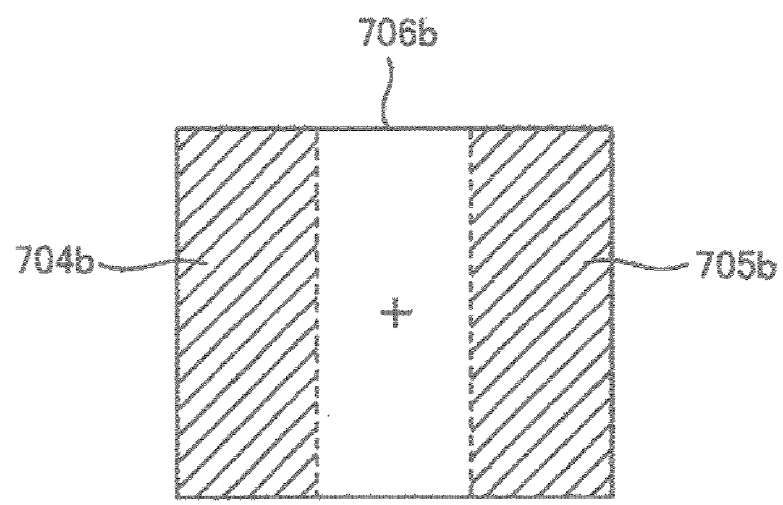

FIG.10
(a)
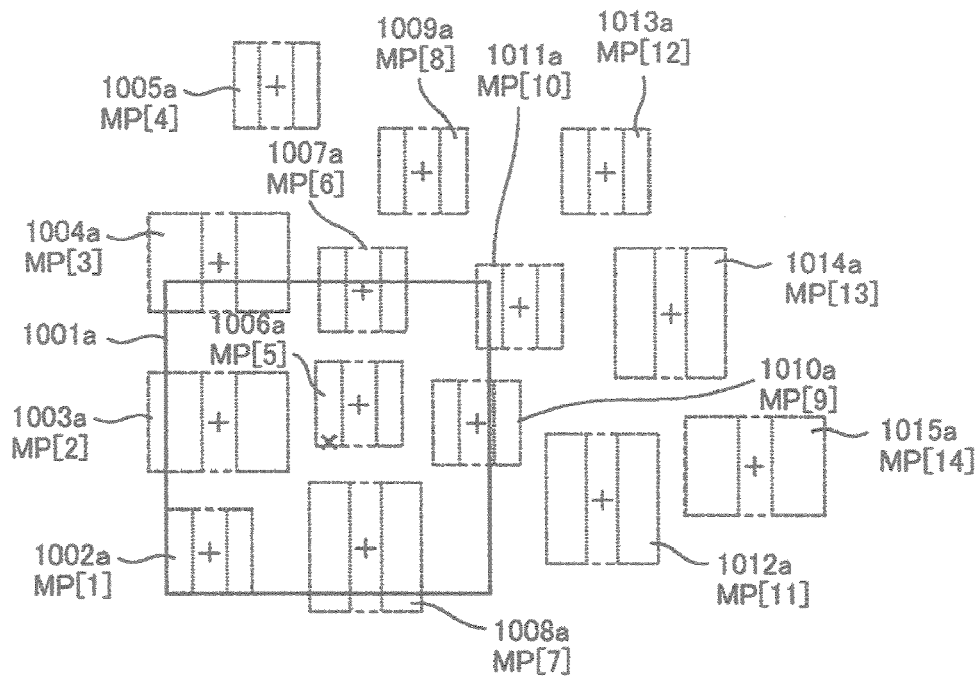
(b)
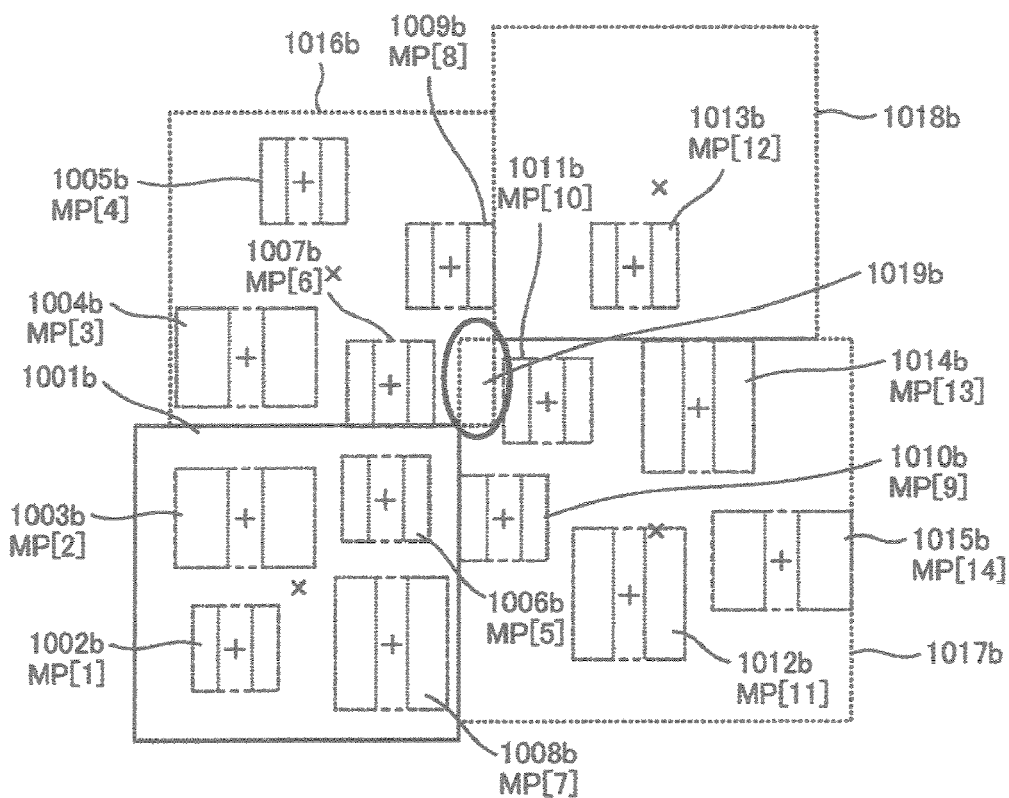

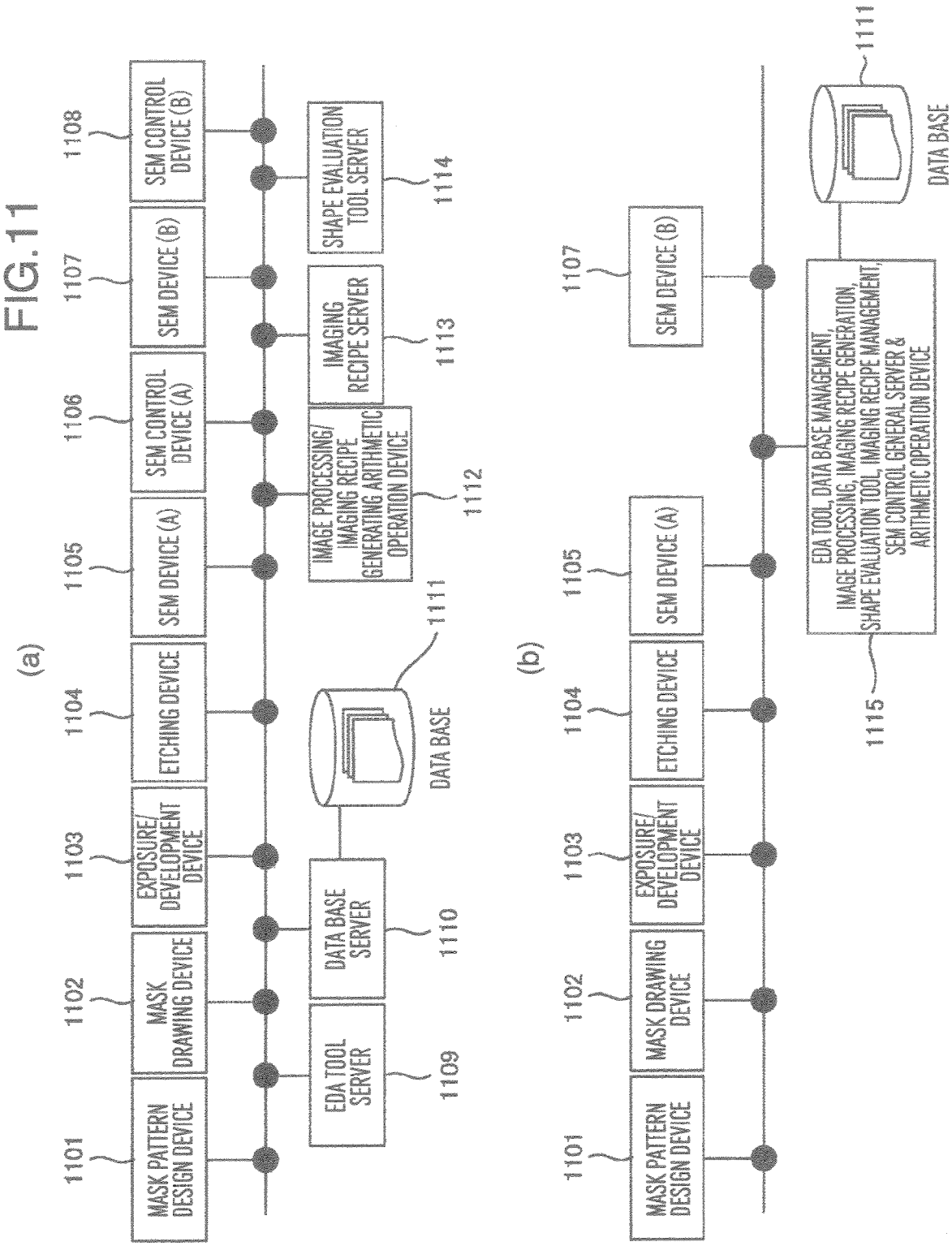

CHARGED PARTICLE RADIATION DEVICE AND IMAGE CAPTURING CONDITION DETERMINING METHOD USING CHARGED PARTICLE RADIATION DEVICE

RELATED APPLICATIONS

This application is the U.S. National Phase under 35 U.S.C. §371 of International Application No. PCT/JP2009/006207, filed on Nov. 19, 2009, which in turn claims the benefit of Japanese Application No. 2008-331826, filed on Dec. 26, 2008, the disclosures of which Applications are incorporated by reference herein.

TECHNICAL FIELD

The present invention relates to a charged particle radiation device and an image capturing condition determining method using the charged particle radiation device. In particular, the present invention relates to a charged particle radiation device for capturing an image by including a plurality of measurement points or inspection points in one field of view, and an image capturing condition determining method using the charged particle radiation device.

BACKGROUND ART

The charged particle radiation device represented by the SEM (Scanning Electron Microscope) is a device which detects charged particles (such as secondary electrons) obtained by scanning a sample with a charged particle beam such as an electron beam and forms an image. Especially in the SEM for measuring and inspecting semiconductors, a program which stores an operation condition of the device called recipe is previously generated to measure a pattern existing in a desired position on a semiconductor device, and measurement and inspection are executed on the basis of a condition which is set according to the recipe.

In Patent Literature 1, a technique for determining an image capturing area used to set optical conditions (such as focus adjustment, astigmatism correction, brightness, and contrast adjustment) of the SEM in the vicinity of an image capturing point (hereafter also referred to as EP in some cases) for measurement and an area for capturing an addressing pattern for the purpose of pattern search is proposed.

CITATION LIST

Patent Literature

Patent Literature 1: JP-A-2007-250528

SUMMARY OF INVENTION

Technical Problem

As one of the measurement and inspection objects of the SEM, there is a pattern formed by the OPC (Optical Proximity Correction) technique. It is considered that it is necessary to conduct pattern correction with due regard to the proximity effect of light and evaluation of such pattern will become more and more important hereafter in the situation that the dimension of a minute figure on the device is becoming the exposure light wavelength or less of an optical exposure device.

However, a large number of places where there is a fear of deformation due to the proximity effect of light or a large number of correction places exist on one device. The number of places to be measured by the SEM amounts to several thousands sometimes. In other words, a large number of measurement points (MPs) exist on one sample. It requires enormous labor and time to set FOV (Field of View) of the SEM with respect to such a large number of measurement object places. The technique disclosed in Patent Literature 1 exhibits an excellent effect in setting an AP (addressing point), AFC (Auto Focus Correction) point, AST (Auto Astigmatism) point, ABCC (Auto Brightness Contrast Control) point and the like. However, any proposal concerning the FOV setting for the EP is not made.

Hereafter, a charged particle radiation device and an image capturing condition determining method using the charged particle radiation device aiming at setting the position or size of the FOV easily even if there are a large number of measurement points on a sample are proposed.

Solution to Problem

In order to achieve the object, an image capturing condition determining method for determining a field of view (FOV) of a charged particle radiation device to include a plurality of measurement points, the image capturing condition determining method including: making a decision whether a measurement point lies upon each of four sides of the field of view; moving the field of view to move the measurement point to inside or outside the field of view with respect to each of the sides on which a measurement point lies; and determining the field of view position after the movement to be a field of view position of the charged particle radiation device, and a device for implementing the image capturing condition determining method are proposed hereafter. Furthermore, a method, and apparatus, including making a decision whether a measurement point lies upon each of the four sides, and changing a size of the FOV until any of the plurality of measurement points does not lie upon each side are proposed.

Advantageous Effects of the Invention

According to the configuration described heretofore, it becomes possible to set the FOV efficiently even if there are a large number of measurement points on a sample. As a result, it becomes possible to implement high precision measurements efficiently.

BRIEF DESCRIPTION OF DRAWINGS

FIG. 2(a) is a diagram for explaining a state in which a semiconductor wafer is irradiated with an electronic beam, and FIG. 2(b) is a diagram representing states of pixels of an image obtained by detecting electrons which are emitted from the semiconductor wafer by irradiation with the electron beam;

FIG. 3(a) is a flow chart representing a sequence of imaging conducted by the SEM, and FIG. 3(b) is a diagram representing an example of various field of view positions on a low magnification image;

FIG. 7(a) is a diagram representing an arbitrary (p-th) evaluation point EP, and FIG. 7(b) is a diagram representing a critical dimension point;

FIG. 10(a) is a diagram representing a case where critical dimension points are crowded with respect to the imaging range of the EP, and FIG. 10(b) is a diagram for explaining processing which optimizes the imaging range of the EP and incorporates a large number of critical dimension points; and FIG. 11(a) is a diagram representing an example of a device system including a SEM, and FIG. 11(b) is a diagram for explaining another configuration example of the device system.

DESCRIPTION OF EMBODIMENTS

Figure 1:
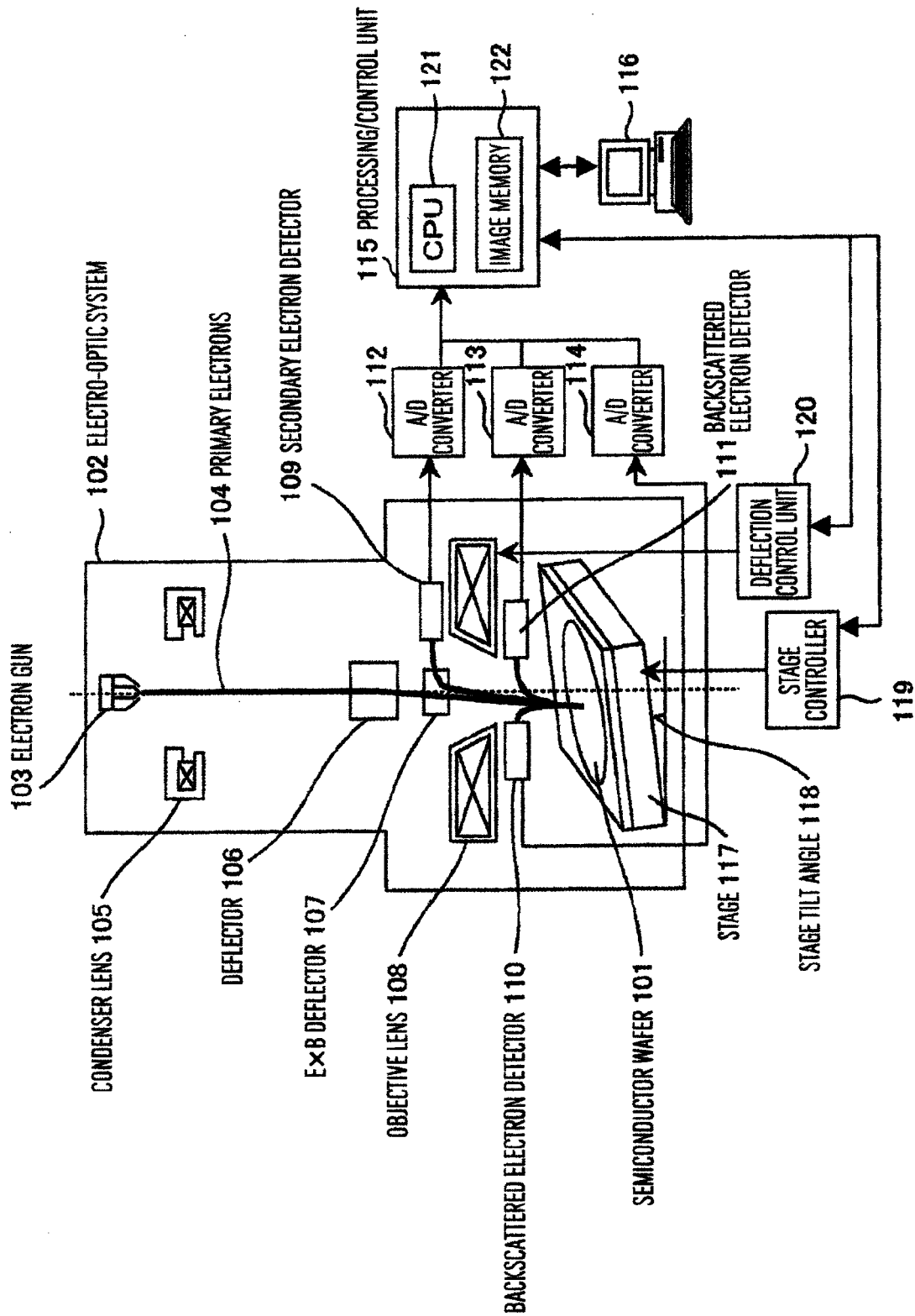
FIG. 1 is a diagram for explaining an outline of a SEM (Scanning Electron Microscope)
Figure 4:
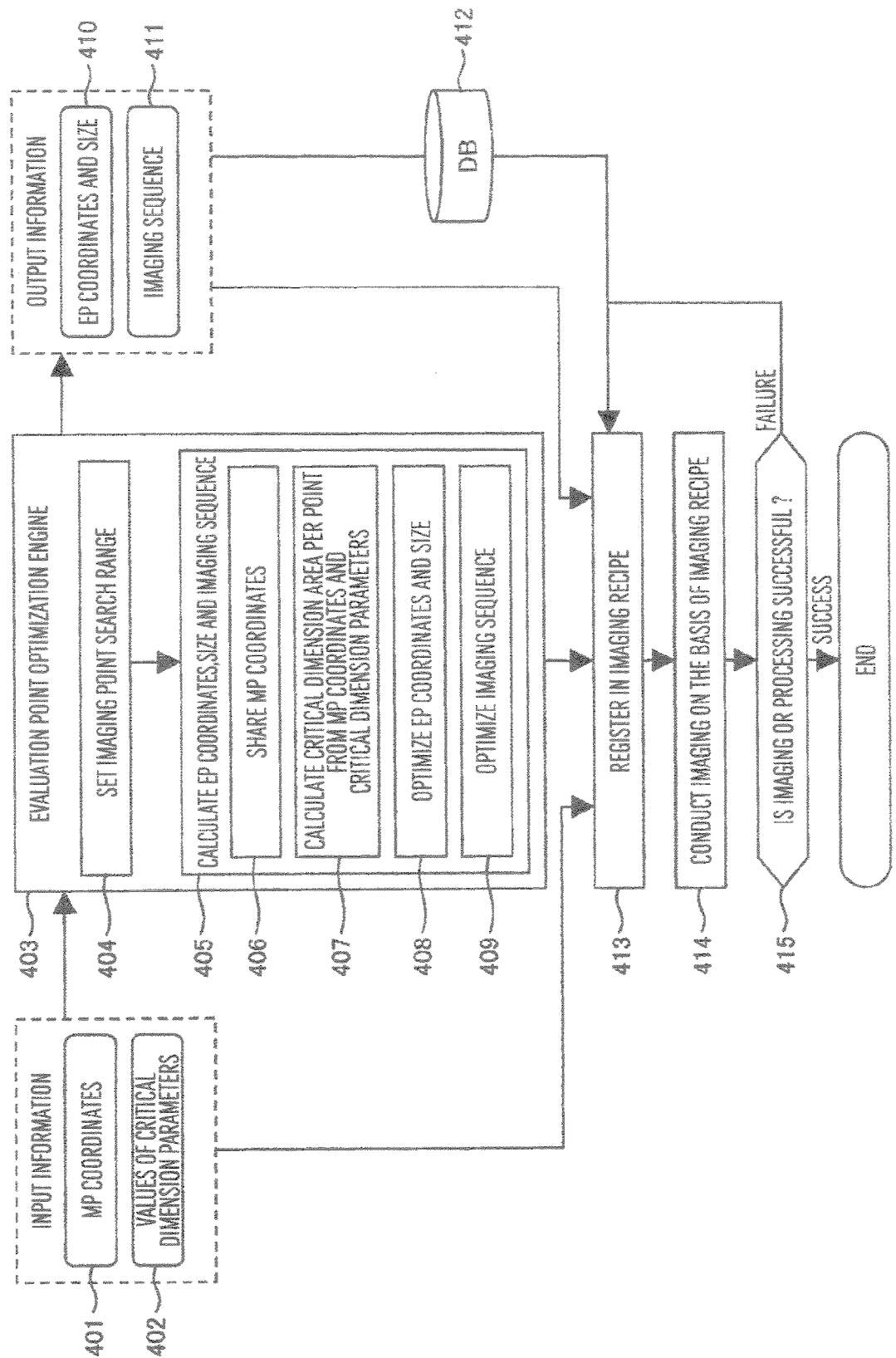
FIG. 4 is a flow chart for explaining optimization processing conducted by an evaluation point optimization engine.

When forming an interconnection pattern on a semiconductor wafer, a method for forming an interconnection pattern by applying an application material called resist onto a semiconductor wafer, laying a mask (reticle) for exposure of the interconnection pattern on the resist, irradiating top of the mask with visible light rays, ultraviolet rays, or an electron beam, and exposing the resist. In the interconnection pattern obtained in this way, the pattern shape changes according to the intensity or diaphragm of irradiating the visible light rays, the ultraviolet rays or the electron beam. For forming a high precision interconnection pattern, therefore, it is necessary to inspect the result of the pattern.

In this measurement, the CD-SEM (Critical Dimension Scanning Electron Microscope) is widely used. Critical points on the semiconductor pattern to be measured are observed as evaluation points (hereafter referred to as EP) by using the SEM, various dimension values such as interconnection widths of the pattern are measured on the basis of the observed image, and the result of the pattern is evaluated on the basis of these dimension values.

For imaging the EP with a high picture quality without a position deviation, imaging points of a part or all of addressing points, auto focus correction points, auto astigmatism points, auto brightness contrast control points (hereafter referred to as ABCC) are set, and addressing, auto focus adjustment, auto astigmatism adjustment, and auto brightness contrast adjustment are conducted at respective imaging points.

Matching is conducted between a SEM image at an AP having coordinates already known which is previously registered as a registered template and a SEM image (actual imaging template) observed in the actual imaging sequence. The deviation quantity of the imaging position in the addressing is estimated as a position deviation quantity in the matching.

The EP, AP, AFC, AST and ABCC are collectively called imaging points. Coordinates, sizes and shapes of points including a part or all of the imaging points, the imaging sequence, the imaging condition, and the registration templates are managed as an imaging recipe. Conventionally, generation of the imaging recipe is conducted manually, resulting in work which requires much labor and time. Furthermore, for determining the imaging points or registering a registration template into the imaging recipe, it is in reality necessary to conduct imaging of the wafer with low magnification. Therefore, the generation of the imaging recipe becomes a cause of the rate of operation falling of the SEM. In addition, because of introduction of the OPC (Optical Proximity Correction) technique or the like due to finer patterns, the number of points of the EP which requires evaluation increases explosively and the manual generation of the imaging recipe is becoming impracticable.

Therefore, it is desirable to apply a semiconductor inspection system including; (a1) the number of points of imaging points (AP, AFC, AST and ABCC) for observing the EP on the basis of circuit design data (hereafter referred to as CAD (Computer Aided Design) data) of a semiconductor which is design information of a pattern on a wafer in a low magnification field of view, (a2) coordinates, (a3) sizes and shapes, (a4) an imaging sequence (including the imaging order of the EP and imaging points and electron beam vertical incidence coordinates), (a5) an imaging position change method (stage shift or beam shift), (a6) imaging conditions (such as the probe current, acceleration voltage, and electron beam scan direction), (a7) partial or all imaging parameters in the imaging sequence, a template evaluation value, or priority order, and registering the imaging parameters and templates such as an AP template in an imaging recipe.

As input information, (b1) coordinates, a size and a shape of EP and an imaging condition serving as evaluation point information, (b2) CAD data (including layer information) around the EP, pattern cutting removal information of mask data, pattern line width information, the kind and process of a wafer to be imaged, and material information of the pattern and underlayer functioning as design pattern information, (b3) a search range of imaging points (AP, AF, AST and ABCC), necessary conditions of selected element index values to be satisfied by imaging points (given by thresholds of the index values), selected element index priority order (given by weights between the index values), inhibition regions which should not be selected as imaging points, a shape estrangement estimation quantity between a design pattern and an actual pattern, and device conditions (stage shift range and stage shift/beam shift estimation error) serving as processing parameters of an imaging recipe automatic generation engine, (b4) a requested positioning precision of a imaging position for each imaging point, a requested picture quality (including requests concerning the focus adjustment, stigmatism adjustment, brightness contrast adjustment, and contamination, and requests concerning an allowable electron beam incidence angle in the EP), and a requested imaging time serving as user requesting specifications, or (b5) history information (such as information of imaging points which resulted in success or failure in the past) is included.

In addition to the above-described input information (b1) to (b5), values of a part of the above-described output information (imaging parameters) (a1) to (a7) or a default value or a settable range is set as input information. In other words, the semiconductor inspection system has a function of setting a combination of arbitrary parameters selected from the above-described (a1) to (a7) and (b1) to (b5) as the input information and recording a combination of arbitrary parameters selected from the above-described (a1) to (a7) as output information.

On the other hand, when generating an imaging recipe used to conduct imaging of a plurality of length measuring points on a sample one after another by using a scanning electron microscope device, a problem described hereafter is considered.

First, for inspecting a result of a semiconductor pattern in the EP, an imaging recipe for imaging the EP must be created. As the semiconductor pattern becomes finer, the number of points of the EP requiring the inspection increases and this poses a problem that enormous labor and time are needed to generate the imaging recipe. As for the automatic generation of the imaging recipe in Patent Literature 1, the case where a SEM operator manually gives the EP coordinates, sizes and imaging conditions under the present circumstances is described. The work time of the SEM operator is not reduced.

Hereafter, a method and a device for efficiently arranging the EPs registered in the imaging recipe with the object of improving the throughput of the scanning electron microscope device on the basis of critical dimension points specified as previously observed places, or a program for controlling the device will be described.

Hereafter, a concrete example of a technique for setting the EP (FOV for measurement) on the basis of a predetermined measurement point will be described.

(i) In a recipe creation method, an imaging recipe for observing the EP on the basis of a critical dimension point previously selected by hot spot extraction or the like is generated. As its output information, (a1) coordinates (position), (a2) the number of points, and (a3) the size and shape of the evaluation point EP including a large number of critical dimension points in the field of view (FOV) for observing the EP are automatically calculated and registered in the imaging recipe.

(ii) As for input information, a combination of arbitrary parameters such as (b1) MP coordinates and critical dimension parameters serving as critical dimension point information, (b2) the EP size as weighting and default to the MP point serving as user's requesting specifications, and (b3) whether optimization of the EP size is conducted is used as the input information. And a combination of the arbitrary parameters (a1) to (a3) is used as output information.

According to the above-described technique, effects described hereafter are obtained.

(i) The number of imaging times can be made smaller by arranging a large number of critical dimension points in the range (FOV) at the time of imaging around the EP. As a result, the throughput of the SEM is improved.

(ii) It is possible to suppress the generation of contamination in the EP without the intervention of the SEM operator. A high precision imaging recipe can be generated in a short time.

Hereafter, concrete contents of the technique, device and program for efficiently setting the EP will be described with reference to the drawings.

1. Summary of SEM 1.1. Device Configuration of SEM

FIG. 1 is a block diagram representing a schematic configuration of a scanning electron microscope (SEM) which captures a secondary electron (SE) image or a backscattered electron (BSE) image of a sample in the present embodiment. The SE image and the BSE image are generically referred to as SEM image. Furthermore, the image captured here includes a top-down image obtained by observing a measurement object from a vertical direction or a part or all of a tilt image obtained by observing from an arbitrary inclination angle direction.

A reference numeral 103 denotes an electron gun, which generates an electron beam 104. A deflector 106 and an objective lens 108 control an irradiation position and a diaphragm of an electron beam to focus the electron beam at an arbitrary position on a semiconductor wafer 101 which is a sample placed on a stage 117 and to irradiate the wafer with the electron beam. Secondary electrons and backscattered electrons are emitted from the semiconductor wafer 101 irradiated with the electron beam. Secondary electrons separated from a trajectory of the irradiating electron beam by an E×B deflector 107 are detected by a secondary electron detector 109. On the other hand, backscattered electrons are detected by backscattered electron detectors 110 and 111. The backscattered electron detectors 110 and 111 are disposed in mutually different directions. Secondary electrons and backscattered electrons detected by the secondary electron detector 109 and the backscattered electron detectors 110 and 111 are converted to digital signals by A/D converters 112, 113 and 114, stored in an image memory 122, and subjected to image processing in a CPU 121 according to the purpose.

FIG. 2 represents a method for imaging a signal quantity of electrons emitted from top of a semiconductor wafer 207 when the top of the semiconductor wafer is scanned and irradiated with an electron beam. For example, as represented in FIG. 2(a), the top of the semiconductor wafer is scanned and irradiated with the electron beam as represented by 201 to 203 in the x direction and 204 to 206 in the y direction. It is possible to change the scanning direction by changing the deflection direction of the electron beam. Places on the semiconductor wafer scanned in the x direction and irradiated with the electron rays 201 to 203 are denoted by $G_1$ to $G_3$, respectively. In the same way, places on the semiconductor wafer scanned in the y direction and irradiated with the electron rays 204 to 206 are denoted by $G_4$ to $G_6$, respectively. Signal quantities of electrons emitted from $G_1$ to $G_6$ have a value 5 of lightness in pixels $H_1$ to $H_6$ in an image 209 represented in FIG. 2(b) (right bottom suffixes of G and H correspond to each other). Reference numeral 208 denotes a coordinate system indicating x and y directions on the image.

A reference numeral 115 in FIG. 1 denotes a computer system, which conducts processing and control in order to image an imaging point on the basis of the imaging recipe, such as transmitting a control signal to a stage controller 119 or a deflection control unit 120, or conducting various kinds of image processing on an image picked up at an arbitrary imaging point on the semiconductor wafer 101. Here, the imaging points include a part or all of APs, AFCs, ASTs, ABCCs and EPs. Furthermore, the processing/control unit 115 is connected to a display 116, and the processing/control unit 115 includes a GUI (Graphic User Interface) which displays an image or the like to the user. A reference numeral 117 denotes an XY stage, which moves the semiconductor wafer 101 and enables imaging in an arbitrary position on the semiconductor wafer. Changing the observation position by using the XY stage 117 is referred to as a stage shift, and changing the observation position by deflecting the electron beam in the deflector 106 is referred to as a beam shift. In general, the stage shift has a property that the movable range is wide but the positioning precision of the imaging position is low. Conversely, the beam shift has a property that the movable range is narrow but the positioning precision of the imaging position is high.

FIG. 1 represented an embodiment having two detectors for the backscattered electron image. However, it is also possible to decrease or increase the number of the backscattered electron image detectors.

Furthermore, the above-described computer system 115 generates an imaging recipe according to a method which will be described later, controls the SEM device on the basis of the imaging recipe, and conducts imaging. However, it is also possible to assign a part or all of these kinds of processing and control to a plurality of different processing terminals to conduct processing and control. Details will be described later with reference to FIG. 3.

As methods for capturing a tilt image obtained by observing a measurement objects from an arbitrary inclination angle direction with the device represented in FIG. 1, there are (i) a scheme for deflecting an irradiation electron beam emitted from an electro-optic system, inclining an irradiation angle of the electron beam, and picking up an inclined image (for example, JP-A-2000-348658), (ii) a scheme for inclining the stage 117 itself which moves the semiconductor wafer (the stage is inclined at a tilt angle 118 in FIG. 1), and (iii) a scheme for mechanically inclining the electro-optic system itself 1.2 SEM Imaging Sequence FIG. 3(a) represents a representative imaging sequence for observing an arbitrary EP. An imaging point, an imaging sequence and an imaging condition are specified by an imaging recipe.

First, a semiconductor wafer which is a sample is attached to the top of the stage 117 in the SEM device at a step 301 in FIG. 3(a). At a step 302, original point deviation of the wafer and the rotation of the wafer are corrected by observing a global alignment mark on the wafer with an optical microscope or the like.

At a step 303, the stage 117 is moved on the basis of the control and processing in the processing/control unit 115 to move the imaging position to the AP, conduct imaging and find a parameter of addressing, and the addressing is conducted by using the already found parameter.

The AP will now be further described. If it is attempted to observe the EP directly by conducting the stage shift when observing the EP, then there is a fear that the imaging point may shift largely according to the positioning precision of the stage. Therefore, the AP with coordinate values of the imaging point and a template (pattern of the imaging point) previously given for positioning is observed once. Since the template is registered in the imaging recipe, the template is hereafter referred to as registration template. The AP is selected from the vicinity of the EP (a movable range by the beam shift even at its maximum). Furthermore, since the AP has in general a lower magnification field of view as compared with the EP, the risk that all of patterns to be imaged will be out of the field of view even if the imaging position shifts somewhat is low. Therefore, the position shift quantity of the imaging point in the AP can be estimated by matching the registration template of the AP registered beforehand with the SEM image (actual imaging template) of the AP actually imaged.

Since the coordinate values of the AP and EP are already known, the relative displacement quantity between the AP and EP can be found. In addition, since the position deviation quantity can also be estimated by the above-described matching, the relative displacement quantity to be actually moved from the AP imaging position to the EP is found by subtracting the position displacement quantity from the relative displacement quantity. It becomes possible to image the EP with a high coordinate precision by conducting movement by the relative displacement quantity by using the beam shift which is high in positioning precision.

Therefore, it is desirable that the registered AP satisfies the following conditions: (i) the registered AP is a pattern existing in a distance over which movement conducted by the beam shift from the EP is possible (in some cases, a condition is made that the range (FOV: Field of View) at the time of AP imaging does not include the FOV at the time of EP imaging in order to suppress generation of contamination in the EP); (ii) the imaging magnification of the AP in light of the positioning precision of the stage is lower than the imaging magnification of the EP; (iii) the pattern shape or the lightness pattern is characteristic, and matching between the registration template and the actual imaging template can be conducted easily. As for which place should be selected as the AP, it is conducted manually by the SEM operator in the conventional technique. On the other hand, there is a feature that favorable AP selection and imaging sequence determination can be conducted automatically.

As for the image template in the registered AP, a CAD image, a SEM image, or a variation is conceivable. In the variation, as disclosed in JP-A-2002-328015, the image template is registered once in a CAD data template and a SEM image of the AP obtained at the time of actual imaging is re-registered as a SEM image template in order to avoid imaging only for the purpose of registering the image template.

The above-described AP selection range will now be completed. Since the electron beam vertical incidence coordinates are typically set to the center coordinates of the EP, the selection range of the AP is set to the beam shift movable range around the EP. In the case where the electron beam vertical incidence coordinates are different from the center coordinates of the EP, the beam shift movable range from the above-described electron beam vertical incidence coordinates becomes the selection range. Furthermore, depending upon the allowable electron beam incidence angle required for the imaging point, the search range from the electron beam vertical incidence coordinates also becomes smaller than the beam shift range sometimes. These are true of other templates as well.

Then at a step 304, the imaging position is moved to the AF to conduct imaging by the beam shift on the basis of control and processing in the processing/control unit 115, and parameters for auto focus adjustment are found and auto focus adjustment is conducted by using the parameters already found.

The AF will now be described further. At the time of imaging, auto focus is conducted to capture a clear image. If the sample is irradiated with an electron beam for a long time, then a contaminant adheres to the sample. In order to suppress the adherence of the contaminant in the EP, therefore, steps of observing coordinates around the EP as the AF once, finding parameters for the auto focus, and then observing the EP on the basis of the parameters, are adopted.

Therefore, it is desirable that the registered AF satisfies the following conditions: (i) the registered AF is a pattern existing within a distance over which movement by the beam shift from the AP or EP is possible, and the FOV at the time of AF imaging does not include the FOV at the time of EP imaging; (ii) the imaging magnification of the AF is nearly equal to the imaging magnification of the EP (However, this is the case of the AF for the EP. In the case of the AF for the AP, the AF is imaged with an imaging magnification which is nearly equal to the imaging magnification of the AP. The same is true of the AST and ABCC as well); and (iii) the registered AF has a pattern shape which can be easily subjected to auto focus (blurring of an image caused by out-of-focus can be easily detected).

Then at a step 305, the imaging position is moved to the AST by the beam shift on the basis of the control and processing in the processing/control unit 115 and imaging is conducted. Then parameters for the auto stigmatism adjustment are found, and auto stigmatism adjustment is conducted by using the parameters already found.

The AST will now be described further. At the time of imaging, astigmatism correction is conducted to capture an image having no distortion. If the sample is irradiated with an electronic beam for a long time, then the contaminant adheres to the sample in the same way as the AF. In order to suppress the adherence of the contaminant in the EP, therefore, steps of for observing coordinates in the vicinity of the EP as the AST, finding parameters for the astigmatism correction, and then observing the EP on the basis of the parameters, are adopted.

Therefore, it is desirable that the registered AST satisfies the following conditions: (i) the registered AST is a pattern existing within a distance over which movement by the beam shift from the AP or EP is possible, and the FOV at the time of AST imaging does not include the FOV at the time of EP imaging; (ii) the imaging magnification is nearly equal to the imaging magnification of the EP; and (iii) the registered AST has a pattern shape which is easily subjected to astigmatism correction (blurring of an image caused by astigmatism can be easily detected).

Then, at a step 306, the imaging position is moved to the ABCC by the beam shift on the basis of control and processing in the processing/control unit 115 and imaging is conducted, and parameters for the brightness contrast adjustment are found and auto brightness contrast adjustment is conducted by using the parameters already found.

The ABCC will now be described further. At the time of imaging, for example, the highest part and the lowest part of the image signal are set to have a full contrast or a contrast which is close to the full contrast by adjusting parameters such as voltage values of a photomultiplier tube in the secondary electron detector 109 in order to capture a clear image having a suitable lightness value and contrast. If the sample is irradiated with an electronic beam for a long time, then the contaminant adheres to the sample in the same way as the AF. In order to suppress the adherence of the contaminant in the EP, therefore, steps of observing coordinates in the vicinity of the EP once as the ABCC, finding parameters for the brightness contrast adjustment, and then observing the EP on the basis of the parameters, are adopted.

Therefore, it is desirable that the registered ABCC satisfy the following conditions: (i) the registered ABCC is a pattern existing within a distance over which movement by the beam shift from the AP or EP is possible and the FOV at the time of ABCC imaging does not include the FOV at the time of EP imaging; (ii) the imaging magnification of the ABCC is nearly equal to the imaging magnification of the EP; and (iii) the ABCC has a pattern similar to that at a critical dimension point in order to make favorable the brightness and contrast of an image picked up at the critical dimension point by using parameters adjusted in the ABCC.

It should be noted that there are the following variations: a part or all of the AP, AF, AST and ABCC imaging at the steps 303, 304, 305 and 306 is omitted in some cases; the order of the steps 303, 304, 305 and 306 is interchanged arbitrarily; or there is a duplication among coordinates of the AP, AF, AST and ABC (for example, the auto focus and the auto astigmatism are conducted in the same place).

Finally, at a step 307, the imaging point is moved to the EP by the beam shift to conduct imaging and, for example, a pattern width is measured under preset critical dimension conditions. In the EP as well, matching between the SEM image picked up and a registration template or the like corresponding to the EP position registered in the imaging recipe, the shift of the measurement position is detected sometimes. The imaging recipe has information such as the coordinates of the imaging points (EP, AP, AF, AST and ABCC), imaging sequence, and imaging conditions written therein, and the SEM observes the EP on the basis of the imaging recipe.

FIG. 3(*b*) represents an example of template positions of EP 309, AP 310, AF 311, AST 312 and ABCC 313 with dotted line frames. Hereafter, a technique for determining the position and size of especially the EP among them will be described.

The present embodiment relates to a method for automatically generating the EP position and size. It is possible to shorten the time required for the recipe generation, thereby improve the total throughput inclusive of imaging preparations of the SEM, and improve the rate of operation of the SEM by automatizing the determination of the EP position and size which has been conducted manually.

[2. Evaluation Point Optimization Function]

[2.1 Input/output Information]

Figure 5:
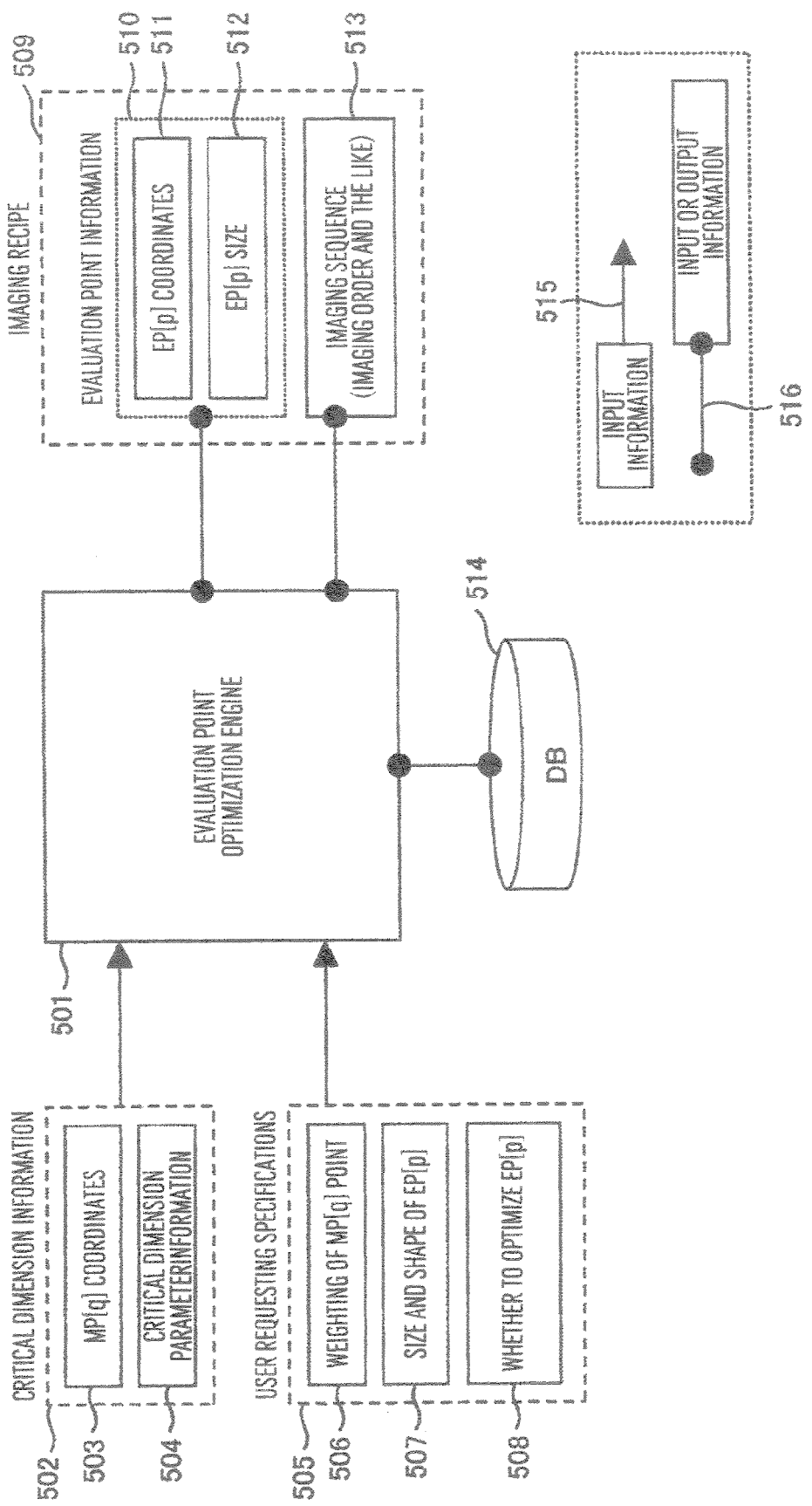
FIG. 5 is a diagram representing a list of input-output information of the evaluation point optimization engine.

In the description of the imaging recipe with reference to FIG. 3, a set of EP, AP, AF, AST and ABCC have been mentioned as an example of information to be registered in the imaging recipe. FIG. 5 especially exemplifies information required for the evaluation point optimization and contents of information which is output as the recipe. In FIG. 5, information 502 to 508 located at end points of arrows (515 is a representation of them) extending to an evaluation point optimization engine 501 is indicated to be input information of the engine 501. Information 509 to 514 located at end points of links (516 is a representation of them) coupled to the engine 501 by black dots is indicated to be able to become the input information and be able to become the output information.

In other words, the engine 501 has a feature that it can conduct calculation and outputting with information obtained by arbitrarily combining the information 502 to 508 and 509 to 514 being the input information and information obtained by arbitrarily combining the information 509 to 514 being the output information. Furthermore, the information obtained by arbitrarily combining the information 502 to 508 and 509 to 514 can be excluded from both the input and output information as unnecessary information. In addition, in the way of giving the input information selected by arbitrarily combining the information 502 to 508 and 509 to 514 and a method for calculating the output information in the engine 501, there are two variations described below. There is a feature that selection can be made from the variations in respective input and information.

(i) As regards the arbitrary information selected as the input information, the user specifies a fixed value of the input information, or sets a default value previously prepared in a data base 514 or the like as the input information. The engine 501 calculates an arbitrary output value supposing the fixed value or the default value. Furthermore, it is possible to make the output information include the input information. In that case, the engine 501 recalculates a proper value of the input information on the basis of the input information which is input, and outputs the proper value.

(ii) As regards the arbitrary information selected as the input information, the user sets a range of a value which can be assumed by the input information, or sets a default value in a range of a value which can be assumed by the input information and which is previously prepared in the data base 514 or the like. The engine 501 calculates arbitrary output information supposing that the input information can change within the range. Furthermore, it is possible to make the output information include the input information. In that case, the engine 501 calculates a proper value of the input information within the range of a value which can be assumed by the input information which is input, and outputs the proper value.

Details of the input-output information 502 to 508 and 509 to 514 of the engine 501 will now be described.

[2.1.1 Input Information]

As the information 502 of the critical dimension point, there are coordinates 503 of a critical dimension point MP[q] and parameter information 504 of the critical dimension point. Here, an array number q indicates IDs of a plurality of critical dimension points which are set on a chip disposed on a wafer (p=1~Nq, Nq≧1). The shape of the evaluation point depends upon the critical dimension parameters.

As user requesting specifications 505, there are weights 506 of the critical dimension points MP[q], sizes and shapes 507 of defaults of evaluation points EP[p], and a decision 508 whether to optimize the EP[p] size. Here, the array number p indicates IDs of a plurality of evaluation points on a chip disposed on a wafer (p=1~Np, Np≧1). The evaluation point typically takes the shape of a square area or a rectangular area. However, another arbitrary shape can also be set as an imaging range.

[2.1.2 Input Information or Output Information]

As evaluation point information 510, there are coordinates 510 of the evaluation points EP[p], sizes 512 of the evaluation points EP[p], and an imaging sequence (such as an imaging sequence) 513. The imaging sequence 513 is provided to specify in which order EP[p] should be imaged or specify how various kinds of processing should be conducted.

The data base 514 stores and manages a part or all of the information of 502 to 513. As for the above described information, information between time series or between different SEM devices can be shared and handled. Furthermore, the evaluation point optimization engine 501 can read arbitrary information from the data base 14 as occasion demands and reflect the arbitrary information to various kinds of processing. Furthermore, when determining values or ranges of the various kinds of information 502 to 513, past parameters stored in the data base 514 can be referred to, and default values of the values or ranges can be stored, for example, every kind or manufacturing process.

[2.2. Evaluation Point Optimization Sequence]

Figure 6:
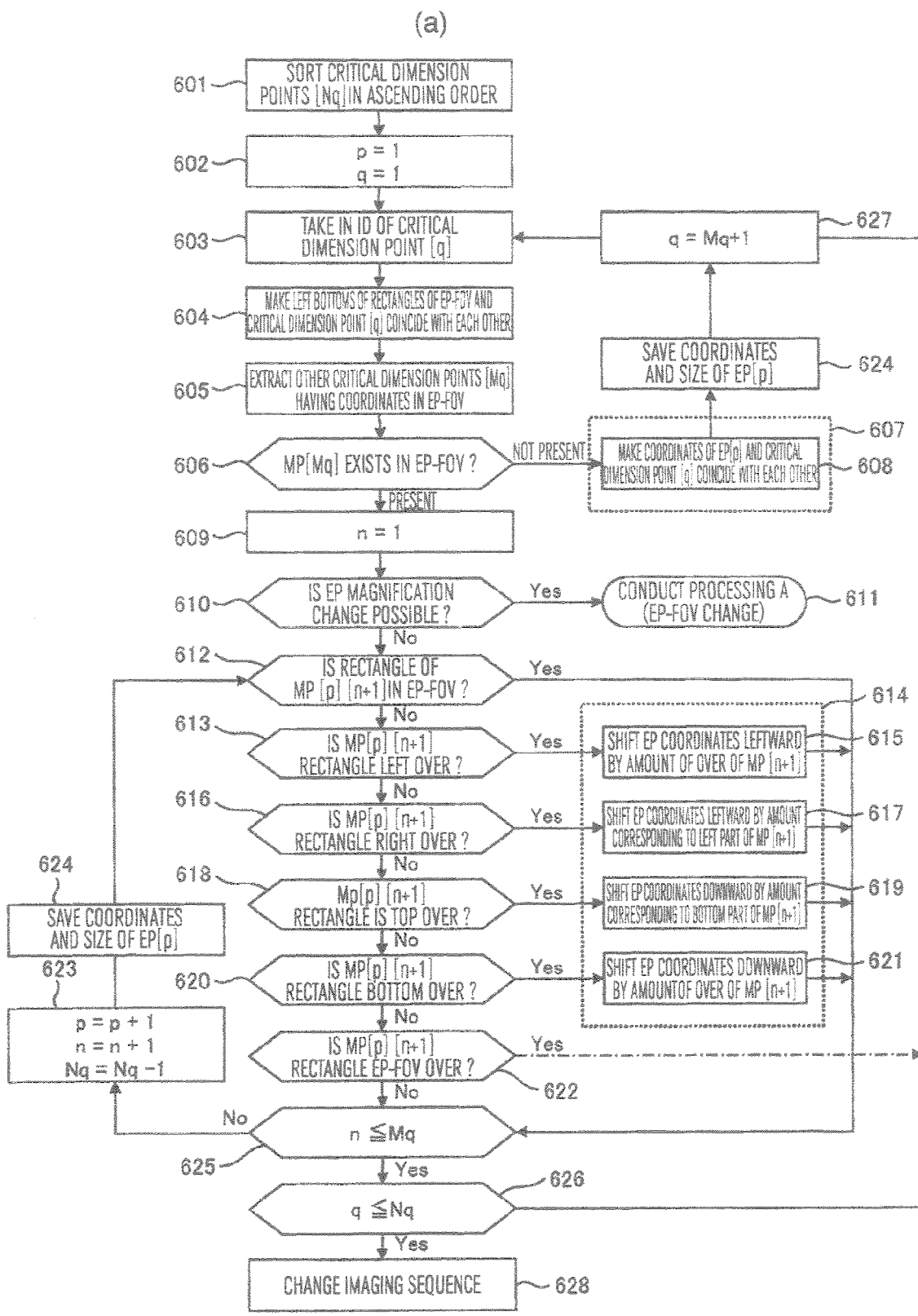
FIG. 6(a) is a flow chart for conducting imaging in an imaging range of an arbitrary (p-th) evaluation point EP as specified by a user.
FIG. 6(b) is a flow chart representing processing concerning processing A (EP-FOV change) in the flow chart represented in FIG. 6(a)
Figure 6:
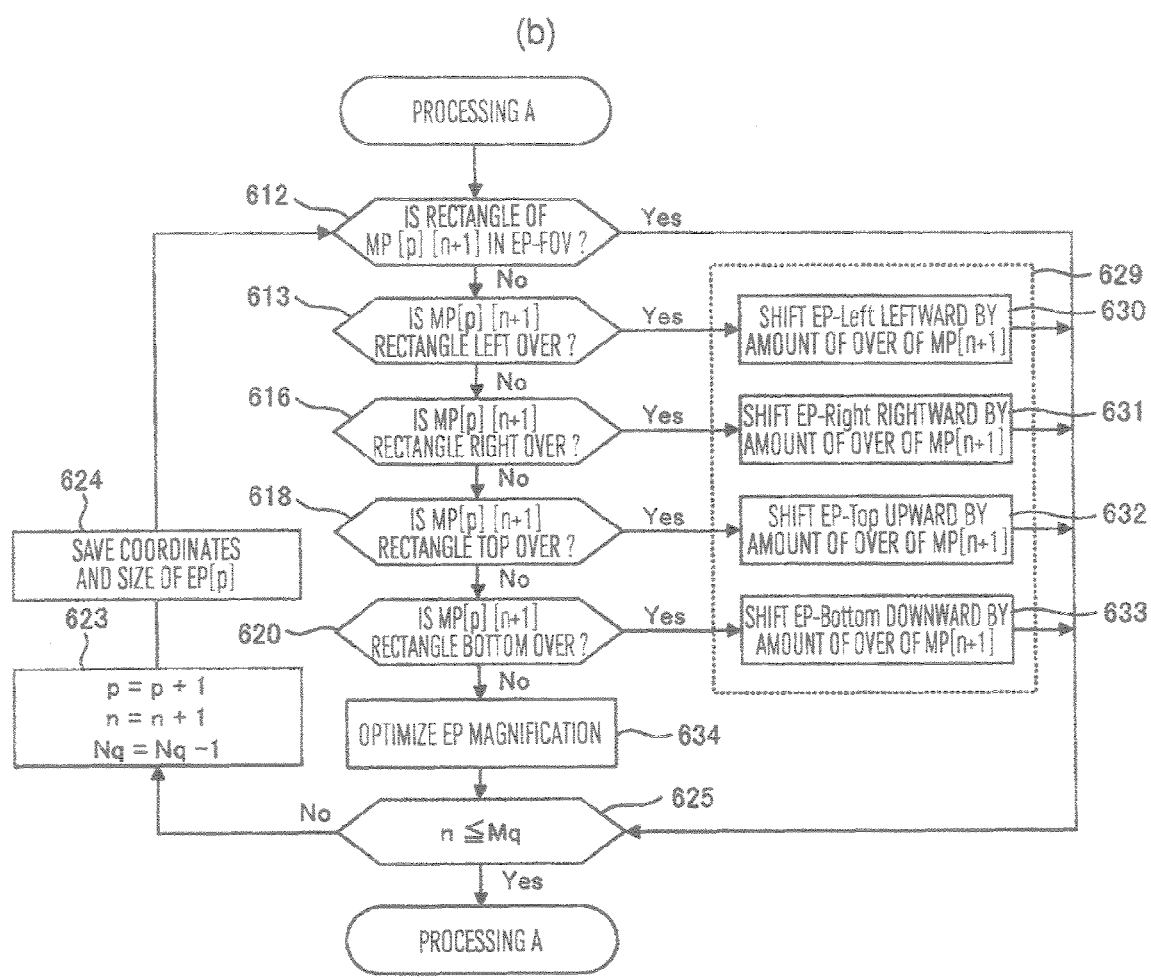

FIG. 6(a) and FIG. 6(b) represent an example of the entire evaluation point optimization processing. First, at a step 601, critical dimension points [Nq] specified by hot spot extraction or the like are sorted in the ascending order, and are aligned in X-Y coordinates. At a step 602, the evaluation point ID [p] and the critical dimension point ID [q] are initialized. At a step 603, the critical dimension point ID [q] which becomes a cardinal point is taken in. At steps 604 to 627, all critical dimension points are observed.

At a step 604, left bottom coordinates of rectangles respectively of the evaluation point ID [p] and the critical dimension point ID [q] are made to coincide with each other. FIG. 7(a) represents details of the rectangle of the evaluation point, and FIG. 7(b) represents details of the rectangle of the critical dimension point.

In FIG. 7(a), 701a denotes an EP-FOV region which is set by a default. In the SEM, there is a region which cannot be specified as a length measuring region in the vicinity of the EP-FOV region which is set. Therefore, the evaluation point optimization engine previously calculates a corrected region 703a by taking a margin 702 represented by a shaded part. This margin is typically determined according to the magnification of the EP. However, this margin can also be specified by the user. Therefore, the rectangle of the evaluation point ID [p] becomes the region of 703a.

FIG. 7(b) is calculated from the critical dimension parameter information 504 of MP[q] included in the critical dimension information 502 which is input. Here, description will be made by taking the line width measurement as an example. In some specified length measurement kinds, however, measurement is not restricted to line width measurement. In the line width measurement, a region 704b specified when measuring the length of a left line segment and a region 705b specified when measuring the length of a right line segment are used as parameter information to calculate a region 706b including them. Since heights and widths of 704b and 705b depend upon parameters in critical dimension at this time, they differ depending upon individual critical dimension points sometimes. If the rectangle of the MP calculated here is not housed in the EP-FOV, the length cannot be measured. Accordingly, the rectangle of the MP calculated here becomes important. Therefore, the rectangle of the critical dimension point ID[q] becomes the region of 706b.

Figure 8:
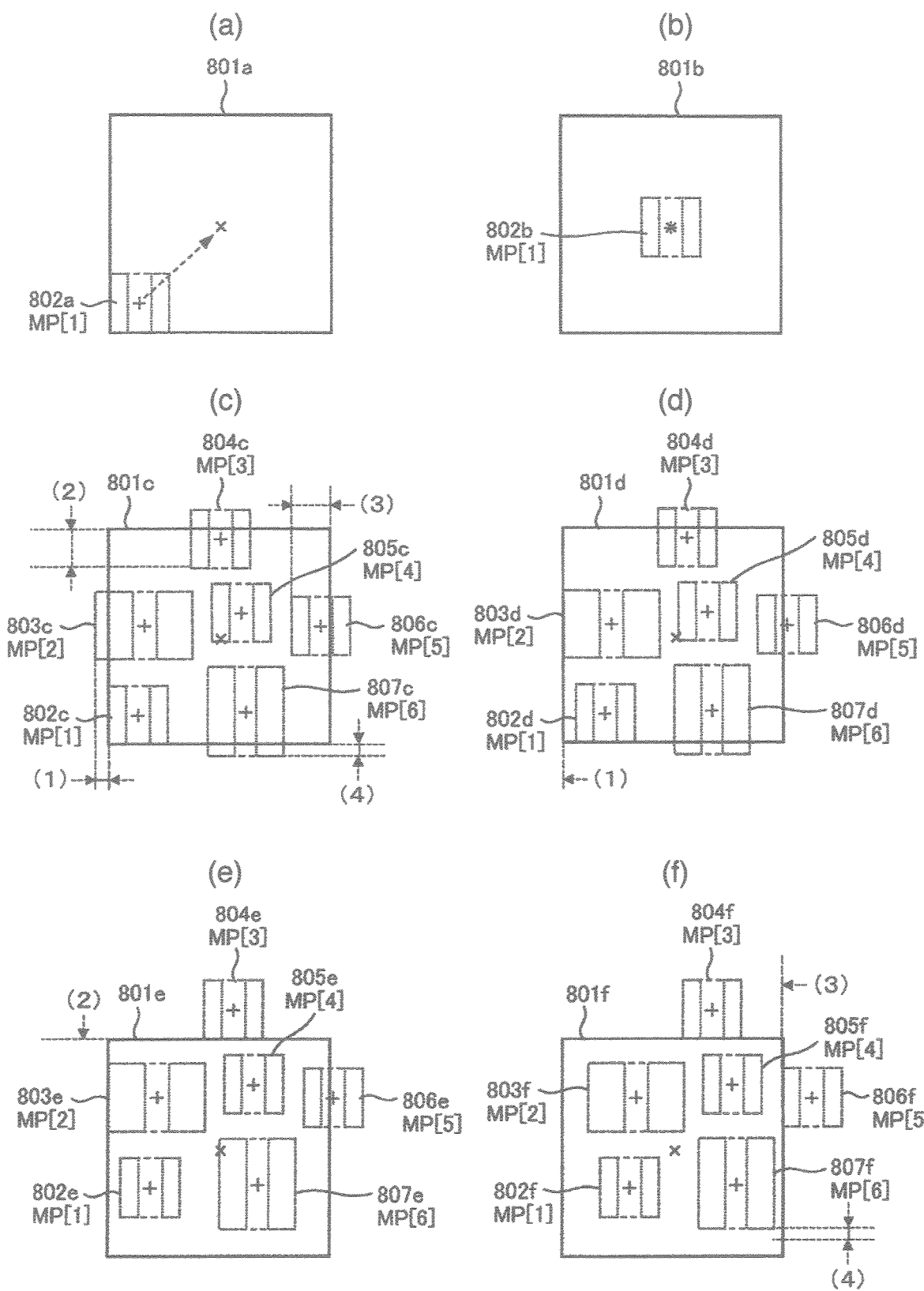
FIG. 8(a) is a diagram representing a case where there is one critical dimension point in the imaging range of the EP.
FIG. 8(b) is a diagram concerning center movement in the case where there is one critical dimension point in the imaging range.
FIG. 8(c) is a diagram representing a case where there are a plurality of critical dimension points in the imaging range of the EP.
FIGS. 8(d) to 8(f) are diagrams for explaining processing which incorporates a large number of critical dimension points without changing the imaging range of the EP from user's specification.

At a step 605, critical dimension points [p] and [n] existing in the EP-FOV disposed at the step 604 are extracted. At a step 606, it is determined whether the critical dimension points [p] and [n] exist in the EP-FOV. If they don't exist, processing at a step 608 is executed. If they exist, processing at a step 609 and subsequent steps are executed. As regards the case where there are not the critical dimension points [p] and [n] existing in the EP-FOV, an image of processing conducted at a step 607 is represented in FIG. 8(a) and FIG. 8(b). As regards the case where there are the critical dimension points [p] and [n] existing in the EP-FOV, an image of processing conducted at step 614 is represented in FIG. 8(c) to FIG. 8(f).

Processing conducted at the step 608 will now be described with reference to FIG. 8(a) and FIG. 8(b). FIG. 8(a) represents the case where there is only MP[1] represented by 802a in the EP-FOV represented by 801a. In this case, the electron beam vertical incidence coordinates are typically set to the center of the EP in the SEM. Therefore, processing for setting the center position of the EP-FOV indicated in 802b at the center of MP[1] is conducted, and coordinates of MP[1] are shifted to a position of 802b in FIG. 8(b). At the step 609, an initial value for processing the other critical dimension point [n] existing in the EP-FOV is substituted.

At a step 610, the decision 508 is made whether to optimize the EP[p] size. According to whether to optimize the EP-FOV or not, the processing is branched.

When not conducting the optimization, processing at steps 612 to 625 is conducted. When conducting the optimization, processing at a step 611 described later is conducted.

At a step 612, a decision is made whether the rectangle of the critical dimension point [p] [n+1] is housed in the EP-FOV or not. This decision is made by comparing coordinates of four sides "left," "right," "top," and "bottom" of the EP-FOV with those of four sides "left," "right," "top," and "bottom" of the rectangle of the critical dimension point [p] [n+1]. This decision is made at steps 613, 616, 618, 620 and 622. Calculation of the evaluation point [p] conducted when not optimizing the EP-FOV and based upon the steps 613, 616, 618, 620 and 622 will now be described with reference to FIG. 8(C) to FIG. 8(F).

An example represented in FIG. 8(C) indicates that there are six points in the critical dimension point [p] [n] extracted at 605 in FIG. 6(a). In the case of the present example, MP[1] represented by 802c is set as the cardinal point for determining the evaluation point EP[p]. Therefore, the MP[1] represented by 802c must be included in EP-FOV of the evaluation point EP[p]. Therefore, processing for causing another critical dimension point to be included in the EP-FOV or excluded from the EP-FOV while causing the whole MP[1] 802c to be included in the EP-FOV is conducted by shifting the evaluation point EP[p] leftward or downward.

By the way, in the present example, it is attempted to simplify the optimization process of the EP-FOV 801c by making a vertex angle of the EP-FOV 801c coincide with a vertex angle of the evaluation point MP[1] 802C serving as a reference. However, this is not restrictive, but, for example, the optimization process of the EP-FOV may be executed in a state in which the vertex angle of the EP-FOV 801c is not made to coincide with the vertex angle of the evaluation point MP[1] 802C serving as the reference. In this case, a rightward shift and an upward shift become possible when conducting the processing for causing another critical dimension point to be included in the EP-FOV or excluded from the EP-FOV while causing the whole MP[1] 802c to be included in the EP-FOV.

According to the above-described technique which actively excludes an MP partially overlapping the EP-FOV from the EP-FOV, it becomes possible to eliminate overlapping scanning of the same MP with an electron beam when a plurality of EP-FOVs are arranged in a region where a large number of MPs are crowded. Therefore, it becomes possible to suppress sample damage such as pattern shrinking and contaminant adherence and a measured value variation, and to implement high precision measurement.

In FIG. 8(C), MP[2] 802c which is the critical dimension point [p] [n+1] exceeds the left side of the EP-FOV. As represented in FIG. 8(d), therefore, the evaluation point [p] is shifted leftward to cause the MP[2] 803d to be included in the EP-FOV. This movement quantity is indicated by (1). This processing corresponds to the step 615 conducted when a decision at the step 613 represented in FIG. 6(a) is "yes."

In FIG. 8(d), MP[3] 804d which is the critical dimension point [p] [n+1] exceeds the top side of the EP-FOV. As represented in FIG. 8(e), therefore, the evaluation point [p] is shifted downward to cause the MP[3] 804e not to be included in the EP-FOV. This movement quantity is indicated by (2). This processing corresponds to the step 619 conducted when a decision at the step 618 represented in FIG. 6(a) is "yes."

Since MP[4] 805e which is the critical dimension point [p] [n+1] represented in FIG. 8(e) is housed in the EP-FOV, nothing is done. This processing corresponds to the case where the decision at the step 612 represented in FIG. 6(a) is "yes."

In FIG. 8(e), MP[5] 806e which is the critical dimension point [p] [n+1] exceeds the right side of the EP-FOV. As represented in FIG. 8(f), therefore, the evaluation point [p] is shifted leftward to cause the MP[5] 806e not to be included in the EP-FOV. This movement quantity is indicated by (3). This processing corresponds to the step 617 conducted when a decision at the step 616 represented in FIG. 6(a) is "yes."

Since MP[6] 807e which is the critical dimension point [p] [n+1] represented in FIG. 8(e) is housed in the EP-FOV, nothing is done.

Heretofore, description has been made with reference to FIG. 8(c) to FIG. 8(f). If the case corresponds to the step 621 conducted when a decision at the step 620 represented in FIG. 6(a) is "yes," processing for shifting the evaluation point [p] downward by a quantity corresponding to excess over the bottom side is generated. In the present example, the critical dimension point serving as the reference is set to the predetermined MP[1] 802c. However, this is not restrictive, but the critical dimension point may be automatically determined according to an arbitrary or predetermined rule. For example, it is also possible to select a critical dimension point existing on the outermost side in the EP-FOV, shift the EP-FOV to cause a position of a vertex angle of a rectangle region of the critical dimension point to coincide with a position of a vertex angle of the nearest EP-FOV, and then attempt to make the position of the EP-FOV proper on the basis of the above-described procedure. Alternatively, it is also possible to conduct weighting on the basis of the importance, the priority order of the measurement, or the like at every critical dimension point, and determine the critical dimension point serving as the reference.

If the four sides, i.e., the left, right, top and bottom sides of the rectangle of the critical dimension point [p] [n+1] are judged at the step 622 represented in FIG. 6(a) to be out of the EP-FOV because of the above-described shift processing, a return to an undisposed critical dimension point [q] is conducted. A step 623 in FIG. 6(a) corresponds to the increment processing in the processing conducted at the step 605. At a step 624 in FIG. 6(a), coordinates calculated at the evaluation point EP[p] and the "Left," "Right," "Top," and "Bottom" are saved, and used as elements for making a decision to prevent a region calculated at the next evaluation point EP[p+1] from overlapping the evaluation point EP[p]. Until it is judged at a step 625 in FIG. 6(a) that all critical dimension points [p] [n] existing in the EP-FOV extracted at the step 605 have been processed, the processing at the steps 612 to 624 is repeated.

A detailed flow concerning the step 611 in FIG. 6(a) is represented in FIG. 6(b). Processing represented in FIG. 6(b) is based upon a concept that the region of the EP-FOV is expanded up to an allowable range and a large number of critical dimension rectangles [p] [n] are taken into an evaluation point range of one point, and its device. The allowable range of the EP-FOV region is specified by registration or the like from the user.

At the step 612, a decision is made whether the rectangle of the critical dimension point [p] [n+1] is housed in the EP-FOV or not. This decision is made by comparing coordinates of the four sides, i.e., "Left," "Right," "Top," and "Bottom" of the EP-FOV with those of the four sides, i.e., "Left," "Right," "Top," and "Bottom" of the critical dimension point. This decision is executed at the steps 613, 616, 618, 620 and 622.

Calculation of the evaluation point [p] conducted in the case where the EP-FOV is not optimized on the basis of the decision at the steps 613, 616, 618, 620 and 622 will now be described with reference to FIG. 9(a) to FIG. 9(f). FIG. 9(a) represents that there are six critical dimension points [p] [n] extracted at the step 605 in FIG. 6(a). At this time, MP[1] 902a becomes a cardinal point for determining the evaluation point EP[p] in the EP-FOV 901a. Accordingly, the MP[1] 902a must be included in the EP-FOV of the evaluation point EP[p]. In FIG. 9(a), MP[2] 903a which is the critical dimension point [p] [n+1] exceeds the "Left" of the EP-FOV. As represented in FIG. 9(b), therefore, a "Left" coordinated of the EP-FOV is shifted leftward to cause MP[2] 903b to be included in the EP-FOV. This movement quantity is indicated by (1). This processing corresponds to a step 630 taken when the decision at the step 613 in FIG. 6(b) is "yes."

In FIG. 9(b), MP[3] 904b which is the critical dimension point [p] [n+1] exceeds the "Top" of the EP-FOV. As represented in FIG. 9(c), therefore, the "Top" coordinate of the EP-FOV is shifted upward to cause MP[3] 904c to be included in the EP-FOV. This processing corresponds to a step 632 taken when the decision at the step 618 in FIG. 6(b) is "yes."

Figure 9:
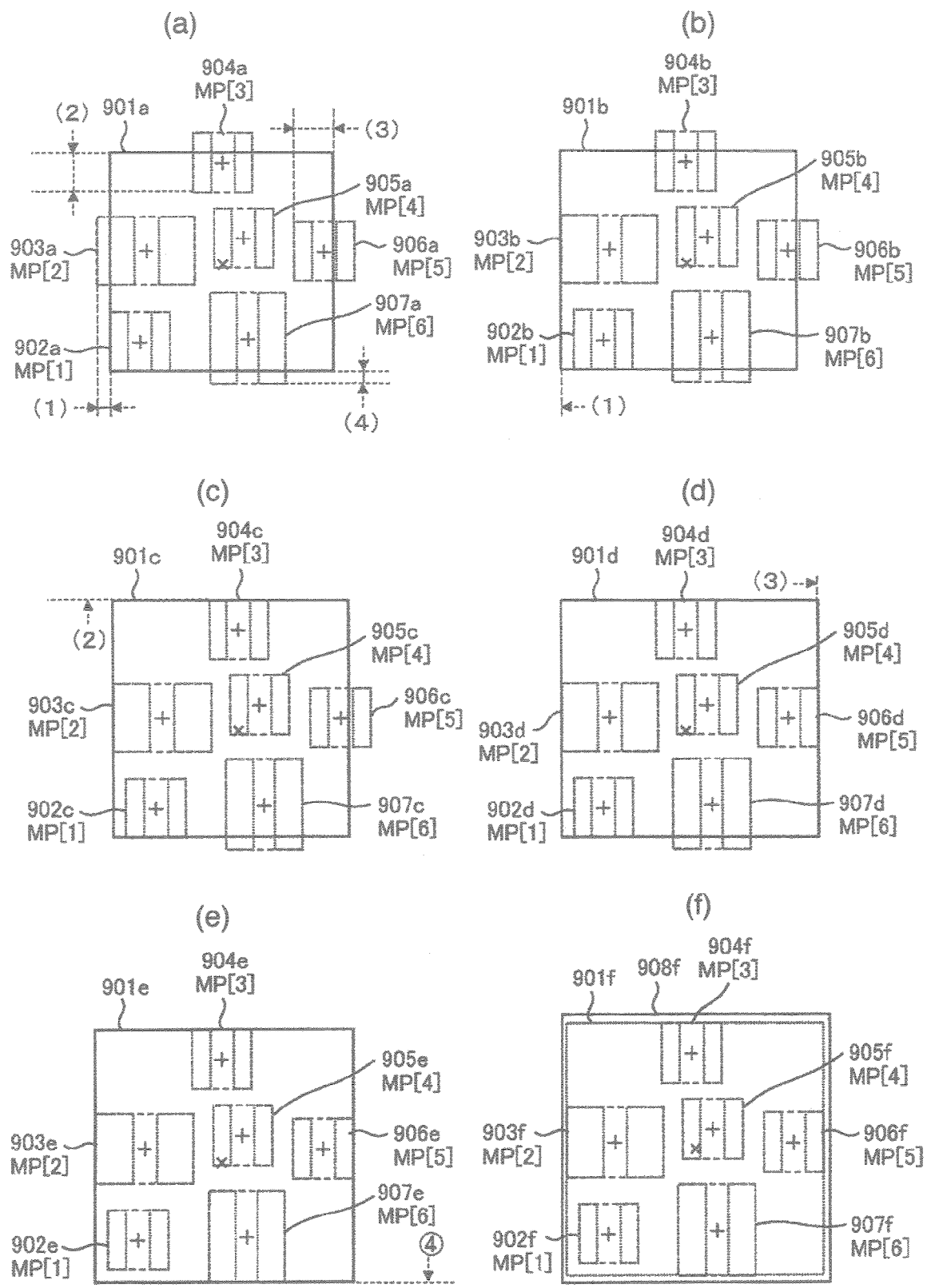
FIG. 9(a) is a diagram representing a case where there are a plurality of critical dimension points in the imaging range of the EP.
FIGS. 9(b) to 9(f) are diagrams for explaining processing which optimizes the imaging range of the EP and incorporates a large number of critical dimension points.

Since MP[4] 905c which is the critical dimension point [p][n+1] is housed in the EP-FOV in FIG. 9(8c), nothing is done. This processing corresponds to the case where the decision at the step 612 in FIG. 6(b) is "yes." In FIG. 9(c), MP[5] 906c which is the critical dimension point [p] [n+1] exceeds the "Right" of the EP-FOV. As represented in FIG. 9(d), therefore, the "Right" coordinate of the EP-FOV is shifted rightward to cause MP[5] 906d to be included in the EP-FOV. This movement quantity is indicated by (3). This processing corresponds to a step 631 taken when the decision at the step 616 in FIG. 6(b) is "yes." Since in FIG. 9(8d) MP[6] 907e which is the critical dimension point [p] [n+1] is housed in the EP-FOV, nothing is done.

Heretofore, description has been made with reference to FIG. 9(a) to FIG. 9(e). If the case corresponds to the step 621 taken when the decision at the step 620 in FIG. 6(b) is "yes," processing for shifting the evaluation point [p] downward by an amount corresponding to excess over the "Bottom" is generated. In FIG. 9(f), correction processing is conducted for finally making the sizes of the evaluation point [p] close to the original shape (a square region, a rectangular region, or another arbitrary shape).

A step 623 in FIG. 6(b) corresponds to the increment processing in the processing conducted at the step 605. At a step 624 in FIG. 6(b), coordinates calculated at the evaluation point EP[p] and the "Left," "Right," "Top," and "Bottom" are saved, and used as elements for making a decision to prevent a region calculated at the next evaluation point EP[p+1] from overlapping the evaluation point EP[p]. Until it is judged at a step 625 in FIG. 6(b) that all critical dimension points [p] [n] existing in the EP-FOV extracted at the step 605 have been processed, the processing at the steps 612 to 624 is repeated.

FIG. 10(a) represents the case where the critical dimension point MP[1] 1002a to the critical dimension point MP[14] 1015a given by hot spot extraction processing are crowded.

A solid line part 1001b in FIG. 10(b) is calculated by the processing represented in FIG. 6(a). At this time, evaluation points EP in dotted line parts 1016b to 1018b are calculated from their critical dimension points [q] one after another. Depending upon the arrangement, a case where a region of an evaluation point EP 1016b and a region of the evaluation point EP 1016b overlap as indicated by 1019b occurs. Originally, the overlapping of evaluation point regions poses a problem that contamination is caused. However, the overlapping of margin regions represented by 702a in FIG. 7(a) poses no problem. In some cases, however, it becomes critical as the actual imaging recipe. As regards such overlapping place, it is also possible for the evaluation point optimization engine to notify the user which evaluation point [p] is a critical place.

[4. System Configuration (Data Base Managing and Sharing)]

A system configuration including the SEM in the present embodiment will now be described with reference to FIG. 11(a) and (b). In FIG. 11(a), a reference numeral 1101 denotes a mask pattern design device, 1102 a mask drawing device, 1103 a mask pattern exposure/development device, 1104 an etching device, 1105 and 1107 SEM devices, 1106 and 1108 SEM control devices respectively for controlling the SEM devices, 1109 an EDA (Electronic Design Automation) tool server, 1110 a data base server, 1111 a storage for storing a data base, 1112 an image processing/imaging recipe generating arithmetic operation device, 1113 an imaging recipe server, 1114 an evaluation tool server for generated pattern shape (for example, which compares a shape of SEM image data in the evaluation pattern with that of design data). They can transmit and receive information via a network.

The data base server 1110 has the storage 1111 attached thereto. The data base server 1110 can store or refer to default values, preset values, calculated values, and the like of arbitrary input/output information in linkage with kinds, manufacturing processes, the date and hour, and results of success or failure of imaging or processing. In FIG. 11(a), two SEM devices 1105 and 1107 are connected to the network as an example. In the present invention, the data base server 1111 or imaging recipe servers 1113 can share an imaging recipe in an arbitrary plurality of SEM devices. The plurality of SEM devices can be operated by generating an imaging recipe once. Furthermore, since the plurality of SEM devices share the data base, the result of success or failure of the imaging or processing in the past can be stored fast, and referring to this is helpful to favorable imaging recipe generation.

FIG. 11(b) represents a system in which the devices 1106, 1108, 1109, 1110 and 1112 to 1114 in FIG. 11(a) are integrated to one device 1115 as an example. As in the present example, it is possible to process an arbitrary function by dividing the arbitrary function to an arbitrary plurality of devices or integrating them.

REFERENCE SIGNS LIST

101 Semiconductor wafer
102 Electro-optic system
103 Electron gun
104 Electron beam
105 Condenser lens
106 Deflector
107 E×B deflector
108 Objective lens
109 Secondary electron detector
110, 111 Backscattered electron detector

The invention claimed is:

1. An image capturing condition determining method for determining a position or a size of a field of view to include a plurality of objects of measurement using a charged particle beam, the image capturing condition determining method comprising:
   successively making a decision whether any of a plurality of measurement points existing in the field of view lies upon each of four sides of the field of view;
   moving the field of view or changing the size of the field of view to move a side on which a measurement point lies to inside or outside the measurement point; and
   determining conditions for image capturing using the charged particle beam on the basis of field of view information obtained after the moving or the changing.

2. The image capturing condition determining method according to claim 1, wherein an object of measurement functioning as reference is included in the plurality of objects of measurement, and the moving of the field of view is conducted in a state in which the object of measurement functioning as the reference is disposed in the field of view.

3. The image capturing condition determining method according to claim 1, wherein after the moving the field of view or the changing the size of the field of view has been conducted, a different field of view is set so as not to overlap the field of view.

4. A charged particle beam control device for determining a position or a size of a field of view to include a plurality of objects of measurement using a charged particle beam, the charged particle beam control device successively making a decision whether any of a plurality of measurement points existing in the field of view lies upon each of four sides of the field of view; moving the field of view or changing the size of the field of view to move a side on which a measurement point lies to inside or outside the measurement point; and determining conditions for image capturing using the charged particle beam on the basis of field of view information obtained after the moving or the changing.

5. The charged particle beam control device according to claim 4, wherein an object of measurement functioning as reference is included in the plurality of objects of measurement, and the moving the field of view is conducted in a state in which the object of measurement functioning as the reference is disposed in the field of view.

6. The charged particle beam control device according to claim 4, wherein after the moving the field of view or the changing the size of the field of view has been conducted, a different field of view is set so as not to overlap the field of view.

7. A charged particle radiation device comprising the charged particle beam control device according to claim 4.

* * * * *